(12) United States Patent
Takahashi et al.

(10) Patent No.: US 8,979,469 B2
(45) Date of Patent: Mar. 17, 2015

(54) HEAT TREATMENT APPARATUS AND METHOD OF TRANSFERRING SUBSTRATES TO THE SAME

(75) Inventors: Kiichi Takahashi, Oshu (JP); Terumi Kamada, Oshu (JP); Ittetsu Oikawa, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 168 days.

(21) Appl. No.: 13/559,084

(22) Filed: Jul. 26, 2012

(65) Prior Publication Data

US 2013/0028687 A1 Jan. 31, 2013

(30) Foreign Application Priority Data

Jul. 29, 2011 (JP) ................... 2011-167428

(51) Int. Cl.
*H01L 21/677* (2006.01)
*H01L 21/687* (2006.01)
(52) U.S. Cl.
CPC .... *H01L 21/67766* (2013.01); *H01L 21/67757* (2013.01); *H01L 21/67781* (2013.01); *H01L 21/68707* (2013.01); *Y10S 414/137* (2013.01); *Y10S 414/14* (2013.01)
USPC ............................. 414/810; 414/937; 414/940
(58) Field of Classification Search
CPC .............................. H01L 21/68; H01L 21/677
USPC .................... 414/810, 935, 936, 937, 416.02, 414/416.03, 416.08
See application file for complete search history.

(56) References Cited

U.S. PATENT DOCUMENTS

| 6,203,268 B1 * | 3/2001 | Miyashita ..................... 414/757 |
| 6,769,855 B2 * | 8/2004 | Yokomori et al. ....... 414/416.02 |
| 8,423,175 B2 * | 4/2013 | Abe et al. ...................... 700/214 |

FOREIGN PATENT DOCUMENTS

| JP | 06-271009 A | 9/1994 |
| JP | 2004-311821 A | 11/2004 |
| JP | 2007-251088 A | 9/2007 |
| JP | 2009-260252 A | 11/2009 |
| JP | 2010-56469 A | 3/2010 |

* cited by examiner

*Primary Examiner* — Saul Rodriguez
*Assistant Examiner* — Ashley Romano
(74) *Attorney, Agent, or Firm* — Nath, Goldberg & Meyer; Jerald L. Meyer; Tiffany A. Johnson

(57) ABSTRACT

A heat treatment apparatus includes a vessel loading unit on which a substrate vessel configured to accommodate a plurality of substrates at a first interval is loaded, a substrate holder configured to hold the plurality of substrates at a second interval which is smaller than the first interval, a substrate transfer unit capable of supporting the substrates and configured to transfer the plurality of substrates between the substrate holder and the substrate vessel and includes at least two substrate supporting parts stacked with the first interval therebetween and configured to be simultaneously advanced and retreated relative to the substrate vessel and individually advanced and retreated relative to the substrate holder, and a control unit configured to control an upper one of the at least two substrate supporting parts to be in an inoperative state when a lower one is supporting the substrate.

8 Claims, 14 Drawing Sheets

HEAT TREATMENT APPARATUS AND METHOD OF TRANSFERRING SUBSTRATES TO THE SAME

CROSS-REFERENCE TO RELATED APPLICATION

This application claims the benefit of priority from Japanese Patent Application No. 2011-167428, filed on Jul. 29, 2011, in the Japan Patent Office, the disclosure of which is incorporated herein in its entirety by reference.

TECHNICAL FIELD

The present disclosure relates to a heat treatment apparatus, which performs heat treatment on a substrate such as a semiconductor wafer, and a method of transferring a substrate to the apparatus.

BACKGROUND

As an example of a semiconductor manufacturing apparatus, there is a batch-type vertical heat treatment apparatus that collectively heats a plurality of wafers. Such a heat treatment apparatus includes a wafer boat that vertically holds the plurality of wafers at, e.g., a predetermined interval, and a transfer mechanism by which the transfer of the wafers is performed between the wafer boat and a carrier, e.g., a FOUP (Front-Opening Unified Pod), where the plurality of wafers are accommodated.

In the heat treatment apparatus configured as above, in order to increase the number of wafers to be processed in one process, decreasing an interval between the wafers supported by the wafer boat is required. In this case, a plurality of wafer forks, which are arranged at the same interval as the interval between the wafers, are installed in the transfer mechanism such that a plurality of wafers can be loaded into and unloaded from the wafer boat at one time. This configuration increases the number of wafers able to be processed in one process and decreases the period of wafer transfer time, resulting in a higher throughput.

However, when the interval between the plurality of wafer forks meeting the interval between the wafers in the wafer boat becomes small, it is necessary to adjust the interval between the wafer forks in a stricter manner.

In addition, when the interval between the wafers varies depending on, e.g., a thermal expansion of the wafer boat, there may be a case where the wafers cannot be unloaded from the wafer boat.

Also, when the wafers are delivered between the wafer forks and the carrier, the wafer transfer time may not be reduced unless the interval between wafers is set to be equal to the interval between wafer forks. Since a batch-type semiconductor manufacturing apparatus having different intervals between wafers may sometimes be employed in a semiconductor manufacturing factory, it is not preferable to change the interval between wafers in the carrier so as to conform to a specific heat treatment apparatus. As such, it is necessary to repeat a sequence in which one sheet of wafer is loaded into the wafer boat by the wafer fork, thus resulting in degraded wafer transfer efficiency.

SUMMARY

The present disclosure provides some embodiments of a heat treatment apparatus which is capable of enhancing substrate transfer efficiency and a method of transferring a substrate to the apparatus.

According to one embodiment of the present disclosure, provided is a heat treatment apparatus, which includes: a vessel loading unit on which a substrate vessel is loaded, the substrate vessel being configured to accommodate a plurality of substrates at a first interval; a substrate holder configured to hold the plurality of substrates at a second interval, the second interval being smaller than the first interval; a substrate transfer unit having at least two substrate supporting parts capable of supporting the substrates and configured to transfer the plurality of substrates between the substrate holder and the substrate vessel, the at least two substrate supporting parts being stacked with the first interval therebetween and configured to be simultaneously advanced and retreated relative to the substrate vessel and individually advanced and retreated relative to the substrate holder; and a control unit, when a lower substrate supporting part of the at least two substrate supporting parts is supporting a substrate of the plurality of substrates, configured to control an upper substrate supporting part of the at least two substrate supporting parts to be in an inoperative state.

According to another embodiment of the present disclosure, provided is a method of transferring a plurality of substrates from a substrate vessel to a substrate holder using at least two substrate supporting parts capable of supporting the plurality of substrates, wherein the substrate vessel is configured to accommodate the plurality of substrates at a first interval, and the substrate holder is configured to hold the plurality of substrates at a second interval, the second interval being smaller than the first interval, and the at least two substrate supporting parts being stacked with the first interval therebetween, the method includes: advancing the at least two substrate supporting parts simultaneously to the substrate vessel; receiving a respective substrate using each of the at least two substrate supporting parts; retreating the at least two substrate supporting parts simultaneously from the substrate vessel; transferring a first substrate supported by a lower substrate supporting part of the at least two substrate supporting parts to the substrate holder; and transferring a second substrate supported by an upper substrate supporting part of the at least two substrate supporting parts to a position below the first substrate transferred by the lower substrate supporting part in the substrate holder.

According to still another embodiment of the present disclosure, provided is a method of transferring a plurality of substrates from a substrate holder to a substrate vessel using at least two substrate supporting parts capable of supporting the plurality of substrates, wherein the substrate vessel is configured to accommodate the plurality of substrates at a first interval, and the substrate holder is configured to hold the plurality of substrates at a second interval, the second interval being smaller than the first interval, and the at least two substrate supporting parts being stacked with the first interval therebetween, the method includes: unloading a first substrate positioned at a lower position in the substrate holder using an upper substrate supporting part of the at least two substrate supporting parts; unloading a second substrate positioned above the first substrate in the substrate holder using a lower substrate supporting part of the at least two substrate supporting parts; advancing the upper substrate supporting part supporting the first substrate and the lower substrate supporting part supporting the second substrate simultaneously to the substrate vessel; delivering the first and second substrates within the substrate vessel; and retreating the upper and lower substrate supporting parts simultaneously from the substrate vessel.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
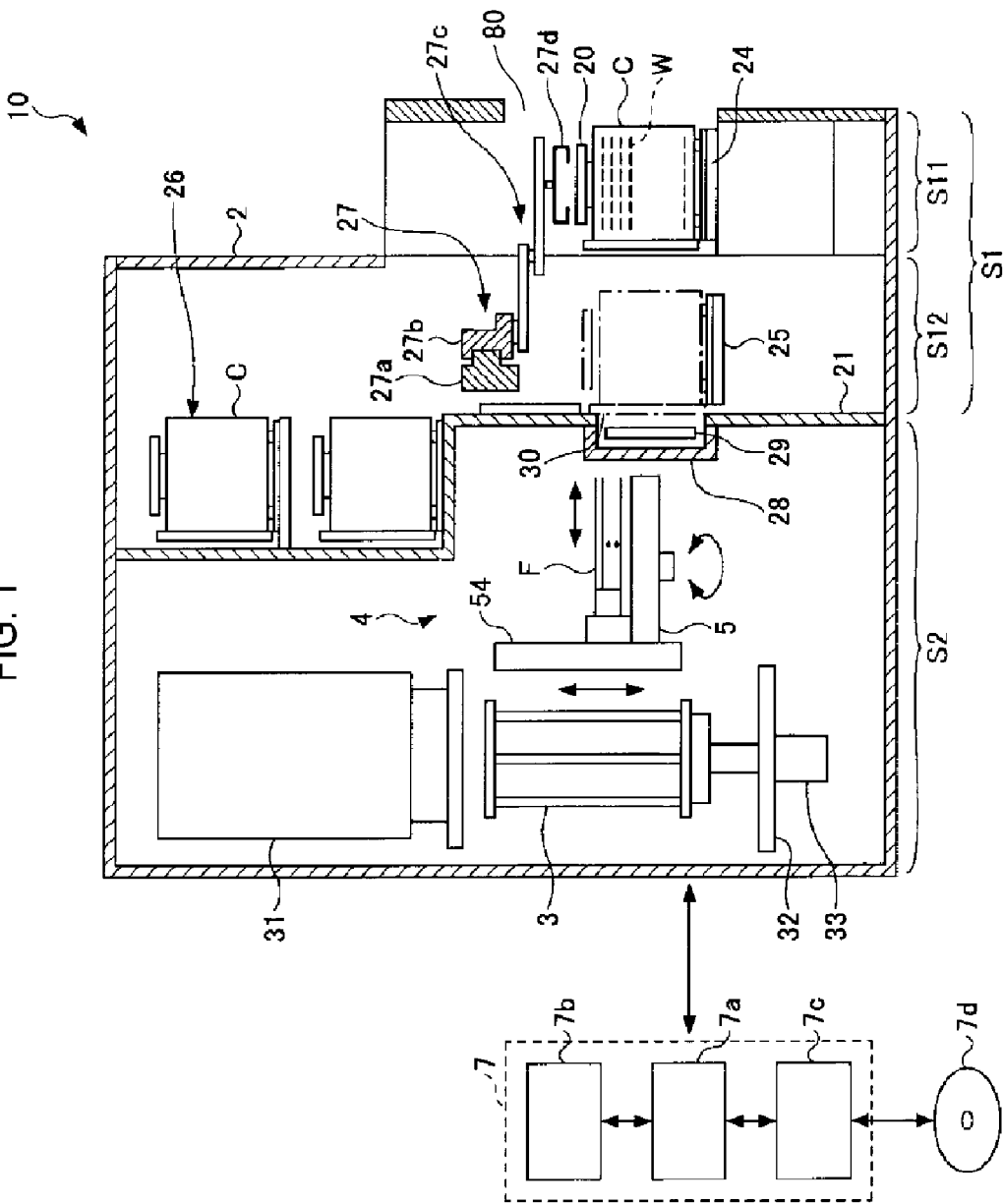
FIG. 1 is a schematic side elevation view of a heat treatment apparatus according to one embodiment of the present disclosure.

Hereinafter, non-limitative exemplary embodiments of the present disclosure will be described in detail with reference to the accompanying drawings. Like reference numerals in the drawings denote like elements, and duplicate descriptions thereof will be omitted. Also, in the drawings, sizes of elements and relative sizes between elements are exaggerated for clarity of illustration. Therefore, the thicknesses and dimensions of the elements should be determined in consideration of the non-limitative exemplary embodiments of the present disclosure by those skilled in the art.

Figure 2:
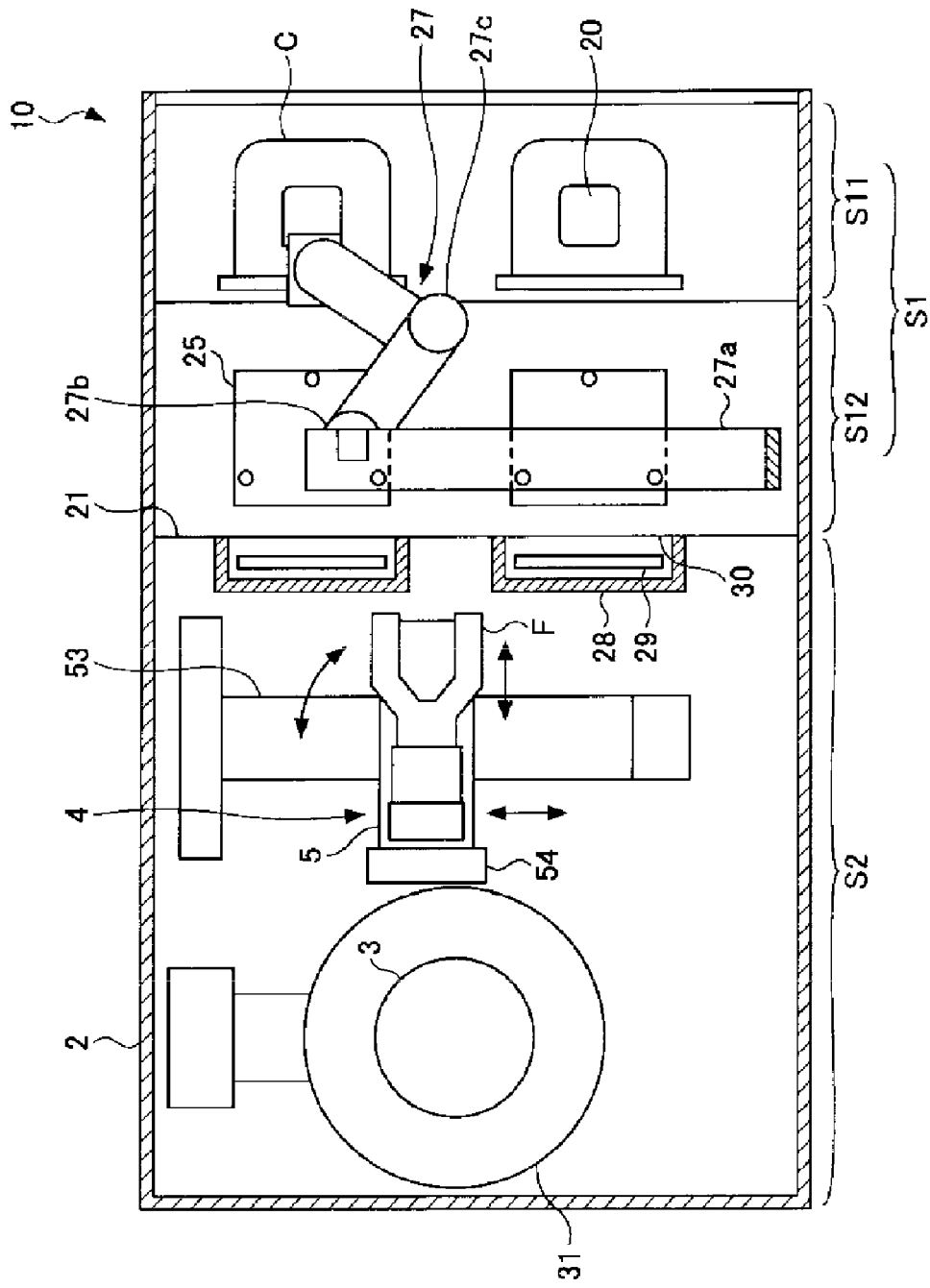
FIG. 2 is a schematic top view of the heat treatment apparatus according to one embodiment of the present disclosure.

FIG. 1 is a schematic side elevation view of a heat treatment apparatus according to one embodiment of the present disclosure, and FIG. 2 is a schematic top view of the heat treatment apparatus shown in FIG. 1. As shown in FIGS. 1 and 2, a heat treatment apparatus 10 includes a loading/unloading region S1 and a processing region S2, which are defined by a housing 2 and a partition wall 21. The loading/unloading region S1 includes a first sub-region S11 located at the front side when viewed from the front of the heat treatment apparatus 10, and a second sub-region S12 located behind the first sub-region S11. The loading/unloading region S1 is kept at the same atmosphere as that of the outside of the housing 2 through an opening 80 formed in the housing 2. The processing region S2 is kept at an inert gas atmosphere, e.g., nitrogen (N₂) gas atmosphere, or a clean dry gas atmosphere, which is obtained by operation of a fan filter unit (FFU) (not shown).

Two first loading tables 24, on each of which a carrier C (used as a substrate vessel) is loaded, are installed in the first sub-region S11, the two first loading tables 24 being arranged in a predetermined direction. A plurality of, e.g., 25 substrates (e.g., wafers) W having a diameter of 300 mm, which are to be processed in the heat treatment apparatus 10, are accommodated in the carrier C. Any adjacent two wafers W in the carrier C are disposed at a first interval. The first interval corresponds to a value (i.e., pitch) obtained by adding a thickness of one sheet of wafer W to a distance (i.e., distance between wafers) between one surface of a certain wafer W and one surface of an adjacent wafer W facing thereto. In this embodiment, the first interval may be set to be, e.g., about 10 mm. Further, an opening (not shown) that is opened/closed by an openable lid member (not shown) is formed in the carrier C. Through the opening, the wafers W are carried into/out of the carrier C. The carrier C may be a FOUP (Front-Opening Unified Pod).

The second sub-region S12 is provided with a second loading table 25 used as a vessel loading unit. Further, the second sub-region S12 includes a carrier storage unit 26 configured to store the carrier C therein, and a carrier transfer mechanism 27 configured to transfer the carrier C between the first loading tables 24, the second loading tables 25 and the carrier storage units 26. The carrier transfer mechanism 27 includes an elevating part 27a having a guide rail designed to extend along an arrangement direction of the carriers C in the first sub-region S11, a moving part 27b configured to move in a left-right direction while being guided along the guide rail, and two serially-connected arms 27c installed on the moving part 27b, which are configured to hold a flange 20 installed on the top surface of the carrier C by a holding part 27d, and horizontally transfer the carrier C.

The partition wall 21, which marks the boundary between the loading/unloading region S1 (specifically, the second sub-region S12 thereof) and the processing region S2, has an opening 30 through which the loading/unloading region S1 and the processing region S2 communicate with each other. Disposed at the side of the partition wall 21 facing the processing region S2 are a door 28 configured to open/close the opening 30 and a lid opening/closing mechanism 29 configured to open/close the lid member of the carrier C with the door 28 being closed. After the lid member of the carrier C is opened by the lid opening/closing mechanism 29, the door 28 moves, e.g., upward or downward, by a door opening/closing mechanism (not shown) together with the lid opening/closing mechanism 29 and the lid member so that the transfer of the wafers W is not obstructed. Also, the partition wall 21 is equipped with an inert gas supply pipe (not shown) configured to supply inert gas and an exhaust path (not shown) corresponding to the inert gas supply pipe, which are disposed to face the opening 30. With this configuration, inert gas (e.g., nitrogen gas) is supplied to the inside of the carrier C while the lid member thereof is opened so that the air within the carrier C is displaced with the supplied inert gas.

In the processing region S2, a vertical heat treatment furnace 31 with an opened bottom end is disposed. Below the heat treatment furnace 31, a wafer boat 3 (used as a substrate holder), which is configured to accommodate (or hold) the plurality of wafers W such that they are stacked with a predetermined interval left therebetween, is loaded on a cap 32. The cap 32 is supported by an elevating mechanism 33, which allows the wafer boat 3 to be carried into/out of the heat treatment furnace 31. A wafer transfer mechanism 4 (used as a substrate transfer unit) is disposed between the wafer boat 3 and the opening 30 of the partition wall 21. The wafer transfer mechanism 4 allows the wafers W to be transferred between the wafer boat 3 and the carriers C loaded on the second loading tables 25.

Figure 3:
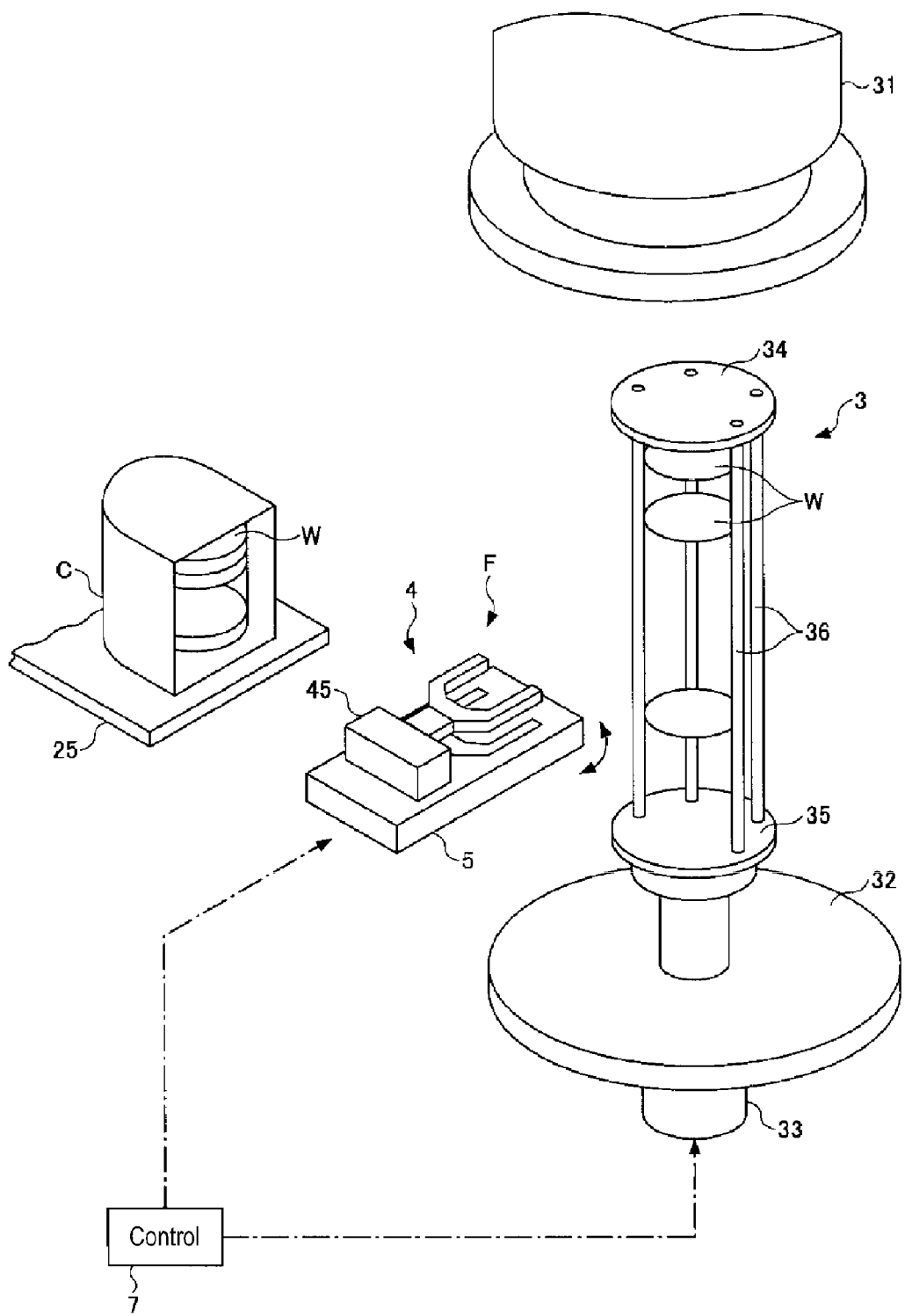
FIG. 3 is a perspective view showing a positional relationship between a wafer boat, a wafer transfer mechanism and a wafer carrier, which are installed in the heat treatment apparatus according to one embodiment of the present disclosure.
Figure 4A:
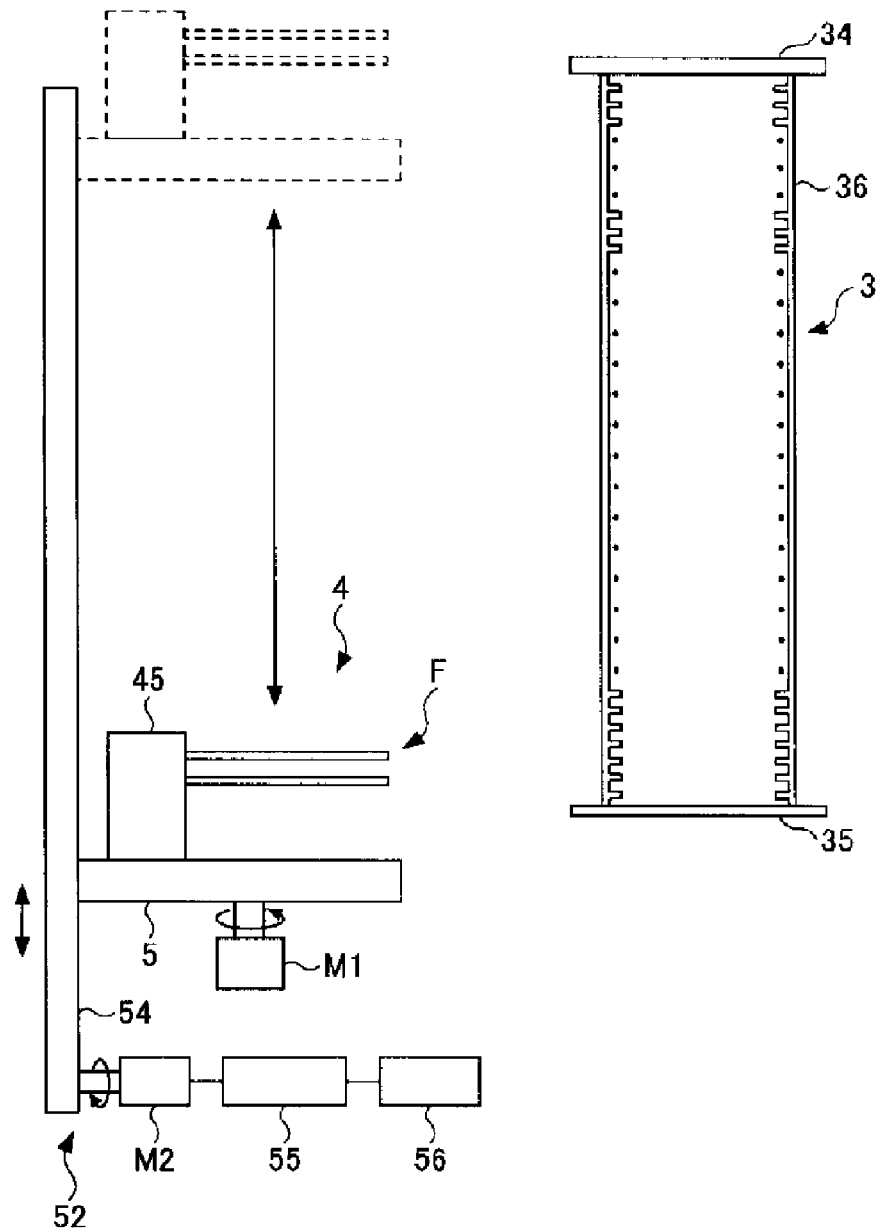
FIGS. 4A and 4B are schematic side views showing the wafer boat and the wafer transfer mechanism, respectively, which are installed in the heat treatment apparatus according to one embodiment of the present disclosure.
Figure 4B:
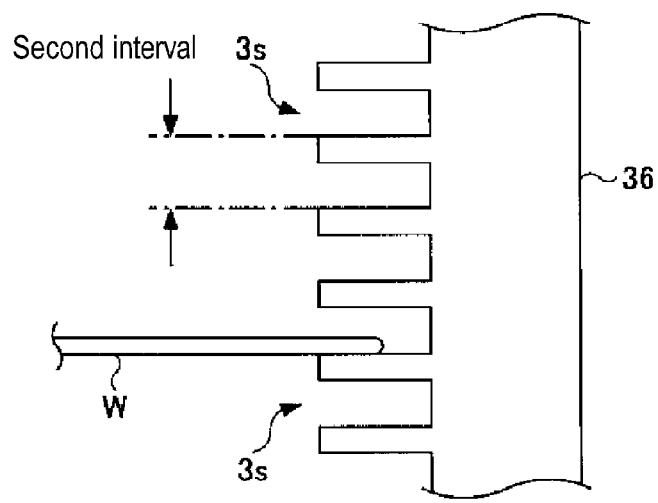

As shown in FIG. 3 and FIG. 4A, the wafer boat 3 is equipped with a ceiling plate 34, a bottom plate 35, a plurality (e.g., four in FIG. 3) of pillars 36 configured to support the ceiling plate 34 with respect to the bottom plate 35. As shown in FIG. 4B, a plurality of slits 3s are formed along inner peripheral surfaces of the pillars 36 at a second interval. The second interval is the sum of the distance between wafers and the thickness of the wafer. In one embodiment, the second interval may be set to be, e.g., about 6 mm so as to increase the number of the wafers W to be loaded on the wafer boat 3. Therefore, the interval between the wafers in the wafer boat 3 (i.e., second interval) is smaller than the interval between the wafers in the carrier C (i.e., first interval). Further, one slit 3s formed on one pillar 36 and a corresponding slit 3s formed on another pillar 36 are formed with the same height. In this manner, the plurality of wafers W are supported by respective slits 3s in the plurality of pillars 36 at the second interval.

The wafer transfer mechanism 4 includes a plurality of (e.g., two) forks F (used as substrate supporting parts) configured to hold a wafer W, and a transfer body 5 configured to displaceably support the forks F. The transfer body 5 is rotatable around a vertical axis by a rotating mechanism comprising a motor M1 (see FIG. 4A) and is vertically movable by an elevating mechanism 52. Also, the transfer body 5 is movable along a guide rail 53 (see FIG. 2) extending in the arrangement direction of the carriers C. The elevating mechanism 52 rotates an elevating shaft (not shown) installed inside of a guide rail 54 extending in, e.g., a vertical direction by a motor M2 such that the transfer body 5 vertically moves along the guide rail 54. The motor M2 is connected to an encoder 55. Connected to the encoder 55 is a counter 56 configured to count the number of pulses generated from the encoder 55.

Figure 5A:
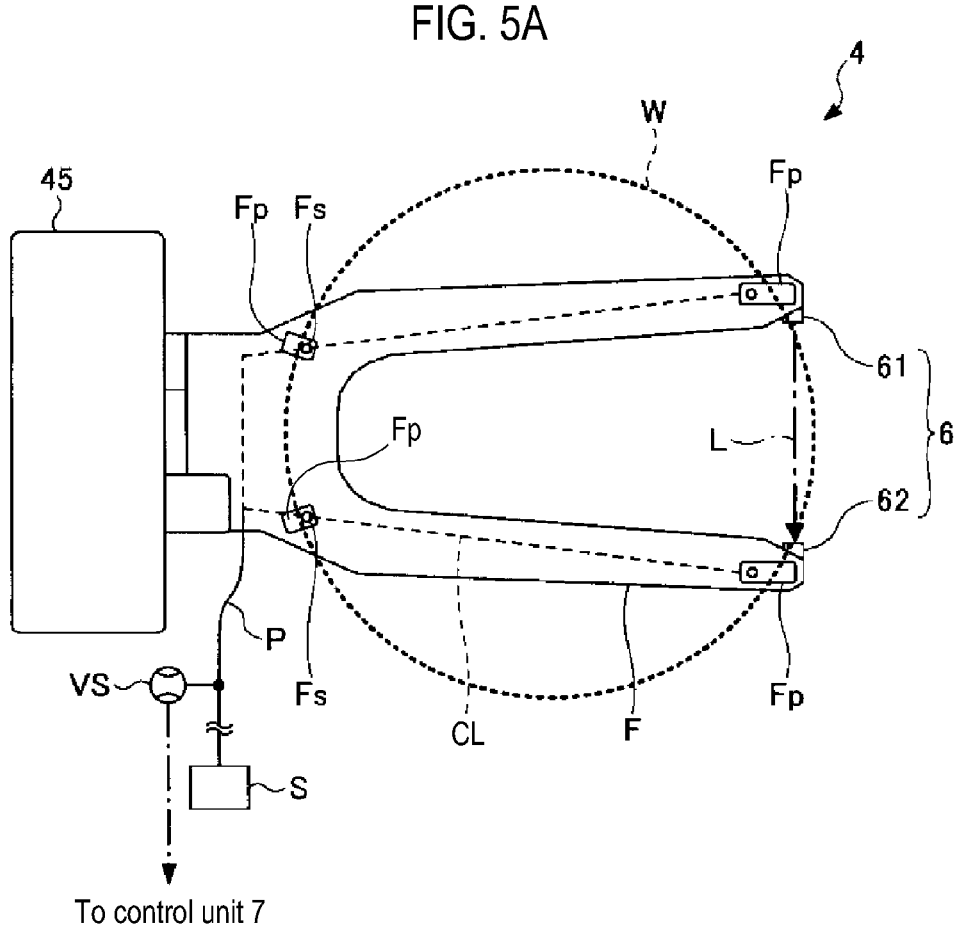
FIGS. 5A and 5B are top and side views, respectively, showing the wafer transfer mechanism of the heat treatment apparatus according to one embodiment of the present disclosure.

As shown in FIG. 5A, each of the forks F has a U-like configuration capable of holding a wafer W when viewed from the top side thereof. The forks F, at a base side thereof, are installed to a reciprocating mechanism 45. The reciprocating mechanism 45 simultaneously or individually moves the two forks F in an anteroposterior direction. Each of the forks F is also equipped with a chuck mechanism (not shown) configured to hold the wafers W by a suction action. Specifically, the forks F are equipped with four pads Fp, each of which having an air inlet Fs formed thereon, which are formed at four respective positions corresponding to a periphery of the wafer W. Each of the air inlets Fs is connected to a suction mechanism S including a vacuum pump or the like, through a conduction line CL formed inside of the fork F and a pipeline P connected to the conduction line CL. Upon start-up of the suction mechanism S, the wafer W is held by a suction action generated therefrom, and upon stopping of the suction mechanism S, the wafer W is released therefrom and is supported by only the pads Fp. A vacuum sensor VS (used as a detection unit) is installed in the pipeline P to measure a pressure within the pipeline P. Based on the measured data provided from the vacuum sensor VS, a control unit 7 (see FIG. 1) determines whether the wafer W is being supported or held.

Further, the pads Fp allow the wafer W that is supported (or held) by the fork F to be spaced apart from a top surface of the fork F. This reduces the occurrence of particles, which may be caused by contacting the rear surface of the wafer W with the top surface of the fork F.

Figure 5B:
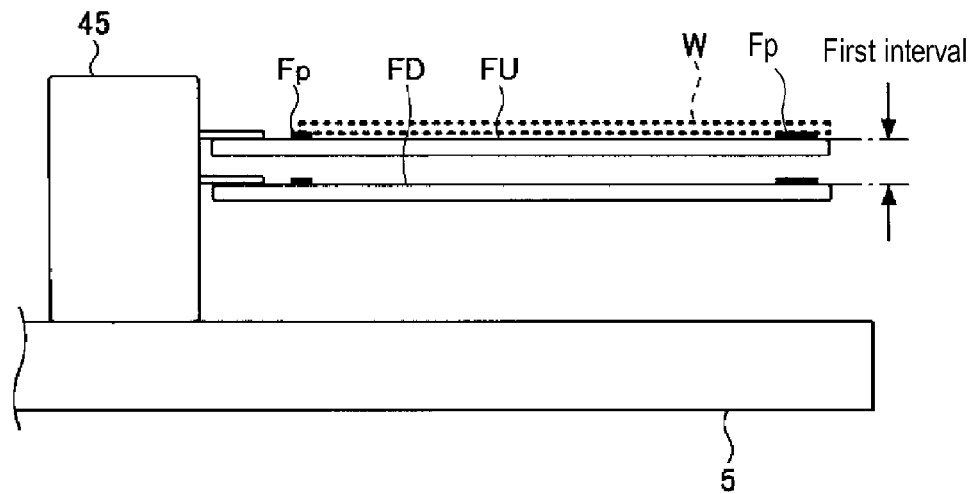

As shown in FIG. 5B, the two forks F are arranged in a vertical direction. In the following description, an upper and a lower fork F are sometimes referred to as FU and FD, respectively, for ease of illustration. The upper fork FU and the lower fork FD are simultaneously or individually movable in the front-rear direction by the reciprocating mechanism 45 and are simultaneously movable in the vertical direction by the transfer body 5. In some embodiments, the sum (or pitch) of an interval between the lower surface of the upper fork FU and the upper surface of the lower fork FD and a thickness of the upper fork FU (or lower fork FD) may be set to be equal to the interval between the wafers (i.e., first interval) in the carrier C. For example, the sum may be set to be about 10 mm.

As shown in FIG. 5A, the lower fork FD is equipped with a mapping sensor 6 including a light emitting element 61 and a light receiving element 62. Specifically, the light emitting element 61 is disposed at one end portion of the lower fork FD with a substantial U-like shape, and the light receiving element 62 is disposed at the other end portion of the lower fork FD. The light emitting element 61 may be composed of, e.g., a laser diode or a light emitting diode. The light receiving element 62 may be composed of a semiconductor light receiving element having a predetermined reception sensitivity with respect to the light emitted from the light emitting element 61.

The mapping sensor 6 detects which of the plurality of slits 3s formed in the pillars 36 of the wafer boat 3 supports the wafers W. Specifically, when the transfer body 5 moves upward from below (or vice-versa) along a longitudinal direction of the wafer boat 3, a light beam L that travels from the light emitting element 61 disposed at the one end portion of the lower fork FD toward the light receiving element 62 is interrupted by an edge of a wafer W supported by the slits 3s in the wafer boat 3. Such interruption represents that the wafer W is supported by the slits 3s. With this configuration, based on the height information of the transfer body 5, which is obtained by counting the number of pulses generated from the encoder 55 with use of the counter 56, and information related to the presence or absence of a wafer W, it is detected which slits 3s in the wafer boat 3 supports the wafers W.

In a wafer mapping operation, the distance between the lower fork FD and the wafer boat 3 may be set such that the edge of a wafer W held by the wafer boat 3 interrupts the light beam L traveling from the light emitting element 61 to the light receiving element 62 of the mapping sensor 6 disposed on the lower fork FD, and also that the end of the lower fork FD and the wafer W are not brought into contact with each other. Specifically, the transfer body 5 is controlled such that the upper and lower forks FU and FD are spaced apart from the wafer boat 3 within a range in which the upper and lower forks FU and FD are not in contact with the wafer W. Subsequently, while moving the transfer body 5 upward from below, the mapping sensor 6 detects (or scans) the wafer W. In the case that no wafer W is detected, the lower fork FD is approached to the wafer boat 3 such that the scanning operation is performed again. Such scanning operation is iteratively performed a predetermined number of times, thus achieving the wafer mapping operation. In some embodiments, if no wafer W is detected, even when the scanning operation is performed the predetermined number of times, the heat treatment apparatus 10 may generate an error alarm.

Referring back to FIG. 1, the heat treatment apparatus 10 is equipped with the control unit 7 configured to control the entire operation of the heat treatment apparatus 10. The control unit 7 includes a processor controller 7a, which may be a processor comprising, e.g., a CPU (Central Processing Unit) or an MPU (Micro Processing Unit) and configured to control operations of respective components of the heat treatment apparatus 10, a user interface 7b and a storage 7c. Further, the control unit 7 is electrically connected to the respective components of the heat treatment apparatus 10, including the carrier transfer mechanism 27, the wafer transfer mechanism 4 (including the motors M1 and M2, the chuck mechanism, etc.), the elevating mechanism 33 and the like. Upon control of a control program (which will be described later), the control unit 7 generates a respective control signal to the respective components.

The user interface 7b may include, e.g., a keyboard with which a factory manager inputs operation information (or commands) to control the heat treatment apparatus 10, a display unit for displaying the operation status of the heat treatment apparatus 10, or the like.

The storage 7c stores a control program (or software) to cause the processor controller 7a of the heat treatment apparatus 10 to perform various operations, or recipe data defining process sequences and conditions. The control unit 7, if desired, controls the processor controller 7a to execute a call of a certain recipe from the storage 7c, in response to a command provided from the user interface 7b, such that the processor controller 7a controls the heat treatment apparatus 10 to perform a desired function. Thus, a desired heat treatment operation is achieved. In other words, the control program causes a computer to control the heat treatment apparatus 10 to perform heat treatment-related functions or heat treatment-related sequences. Also, the control program causes the computer to be used as a means for executing the heat treatment in the heat treatment apparatus 10. The control program or the recipe defining process conditions may be stored in a computer-readable storage medium 7d (such as a hard disk, compact disk, magneto-optical disk, memory card, flexible disk or the like), and may be installed in the processor controller 7a. Further, the control program or the recipe defining process conditions may be installed in the processor controller 7a from another computer via, e.g., a dedicated line.

The following is a description of a heat treatment method which is performed in the heat treatment apparatus 10 configured as above, with reference to FIGS. 6A to 9E together with FIGS. 1 to 5B described above. The heat treatment method includes a substrate transfer method according to one embodiment of the present disclosure. In the following description, it is assumed that a plurality of (e.g., two in FIGS. 6A to 9E, for the sake of simplicity) dummy wafers DW are previously mounted in upper and lower portions of the wafer boat 3, and wafers W for use in production of a semiconductor integrated circuit (IC) are transferred between the dummy wafers DW mounted in the upper and lower portions.

First, the carrier C is loaded on the first loading table 24 (see FIGS. 1 and 2) by an operator of the heat treatment apparatus 10 or a designated automatic transfer robot (not shown). Subsequently, the carrier C is transferred to the second loading table 25 by the carrier transfer mechanism 27 such that the carrier C is brought into hermetic contact with the opening 30 of the partition wall 21. In some instances, the carrier C, after being received in the carrier storage unit 26, may be transferred to the second loading table 25.

Thereafter, the lid member of the carrier C is removed by the lid opening/closing mechanism 29, and then, inert gas (e.g., nitrogen gas) is blown from the gas supply pipe (not shown) to the inside of the carrier C. Thus, the inner atmosphere of the carrier C and a space between the carrier C and the door 28 are substituted with the supplied nitrogen gas. Then, the door 28, the lid opening/closing mechanism 29 and the lid member move, e.g., upward to be retreated from the opening 30 such that the inside of the carrier C and the processing region S2 communicate with each other. Under such configuration, the plurality of wafers W are transferred from the carrier C to the wafer boat 3.

Vertical positions of the two forks F are aligned with respect to the carrier C. Specifically, the vertical positions of the two forks F are aligned such that they are inserted into respective gaps between adjacent wafers W accommodated in the carrier C. For such alignment, the relationship between the reference positions of the forks F (or the reciprocating mechanism 45) and a loading position of the carrier C has been previously understood. As such, the alignment is terminated by locating the forks F (or the reciprocating mechanism 45) at the reference positions. In some embodiments, the mapping sensor 6 installed on the lower fork FD performs a mapping operation on the wafers W in the carrier C so as to detect the position of a wafer W. Based on the detected result at the mapping sensor 6, the positions of the forks F may be aligned again.

Figure 6A:
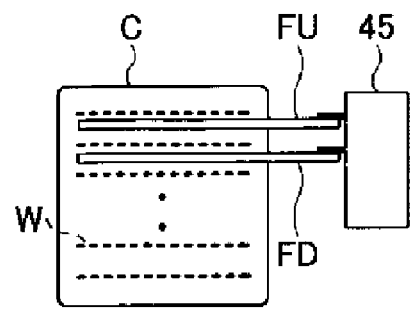
FIGS. 6A to 6E are schematic views illustrating a sequence of substrate transfer procedures in the heat treatment apparatus according to one embodiment of the present disclosure.
Figure 6B:
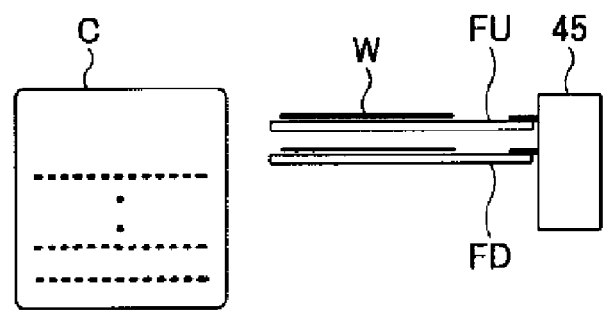

Upon termination of the alignment, as shown in FIG. 6A, the two forks F (i.e., FU and FD) simultaneously enter into the carrier C. At this time, since the interval between the upper and lower forks FU and FD is equal to the interval between the wafers W in the carrier C, both the upper and lower forks FU and FD can enter between the wafers W in the carrier C. Thereafter, the upper and lower forks FU and FD move upward by, e.g., 7.0 mm, and then a superior wafer W is loaded on the upper and lower forks FU and FD, respectively, such that the respective superior wafers W are held by the chuck mechanism of the forks FU and FD. Subsequently, as shown in FIG. 6B, the upper and lower forks FU and FD retreat from the carrier C such that two wafers W (i.e., primary and secondary wafers W) are unloaded from the carrier C.

Figure 6C:
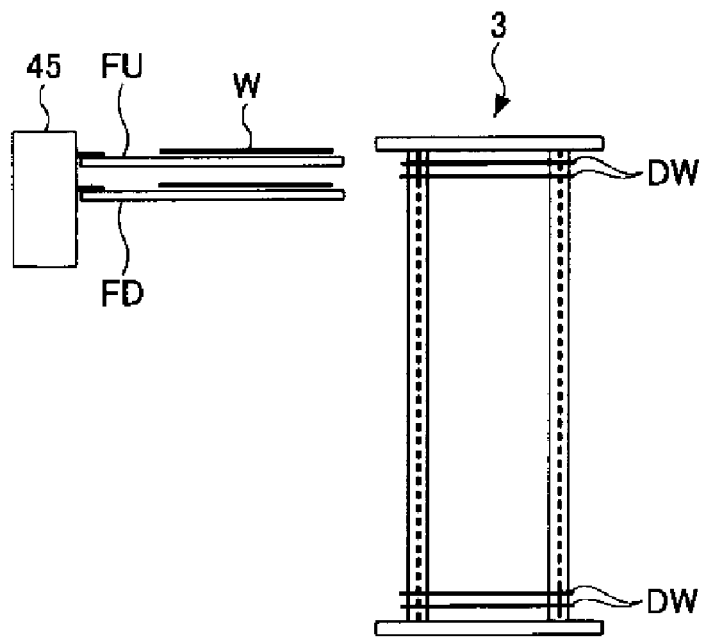
Figure 6D:
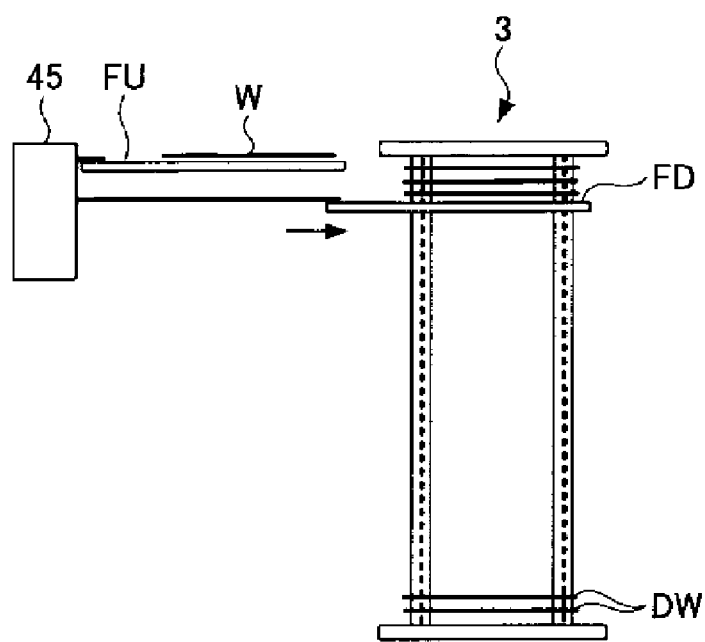
Figure 6E:
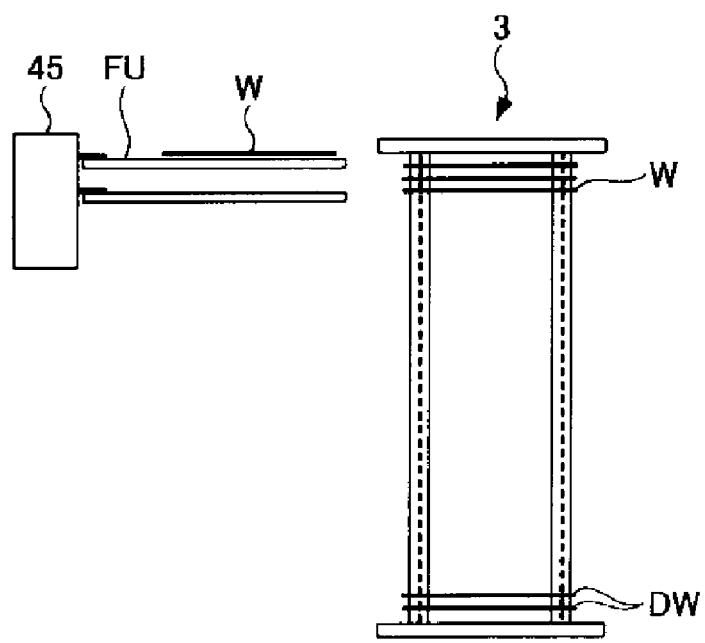

Thereafter, the transfer body 5 (shown in FIG. 4A) rotates around its vertical axis such that the upper and lower forks FU and FD are positioned to face the wafer boat 3. Then, as shown in FIG. 6C, based on the reference positions of the upper and lower forks FU and FD and the position at which the wafer boat 3 is located, the vertical position of the reciprocating mechanism 45 is adjusted such that the primary wafer W supported by the lower fork FD is inserted into the topmost one of the empty slits 3s (i.e., an slit 3s having no wafer W supported thereby) in the wafer boat 3. Subsequently, as shown in FIG. 6D, the lower fork FD moves toward the wafer boat 3 such that the primary wafer W is accommodated within the wafer boat 3. After the chuck mechanism of the lower fork FD is stopped, the reciprocating mechanism 45 moves downward by, e.g., 4.0 mm such that the primary wafer W is supported by the topmost slit 3s in the wafer boat 3. Thereafter, as shown in FIG. 6E, the lower fork FD returns to its original position.

Figure 7A:
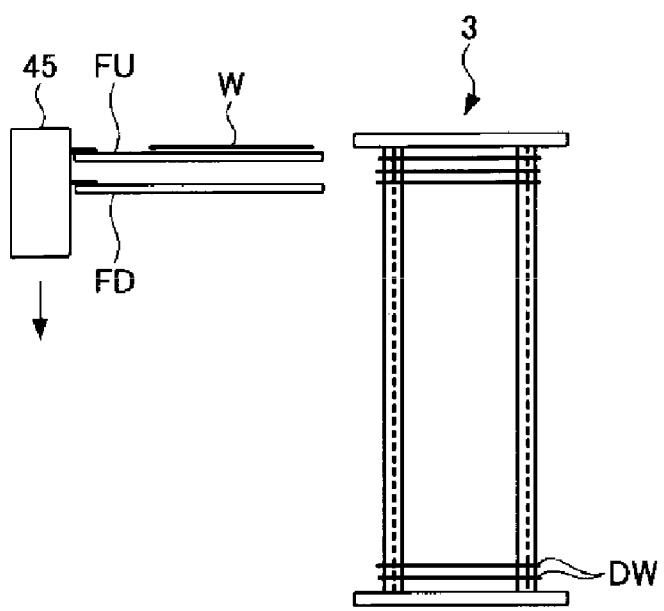
FIGS. 7A to 7D are schematic views illustrating a sequence of substrate transfer procedures, which are conducted after the procedure illustrated in FIG. 6E.
Figure 7B:
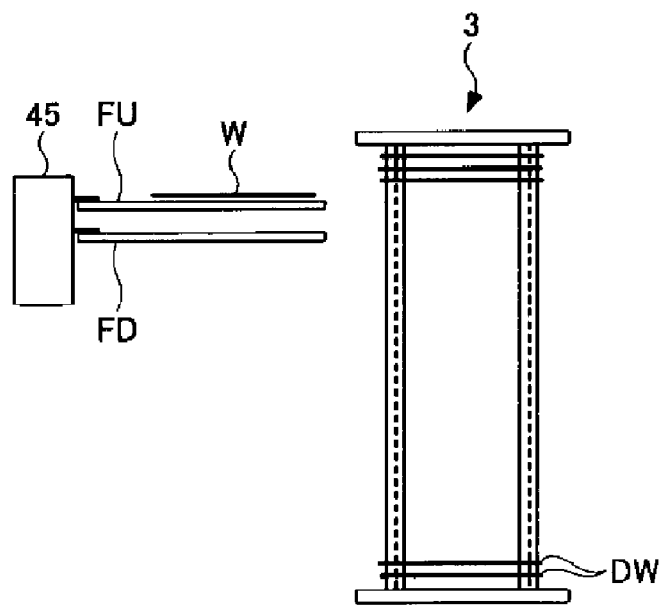

Subsequently, as shown in FIGS. 7A and 7B, the reciprocating mechanism 45 moves downward and a vertical position thereof is aligned such that the secondary wafer W supported by the upper fork FU is inserted into a slit 3s below the topmost slit 3s by which the primary wafer W is supported. Specifically, the reciprocating mechanism 45 moves downward by a distance obtained by subtracting the downward distance (i.e., 4.0 mm) as described above from the sum of the pitch (i.e., 10 mm) between the forks F and the pitch (i.e., 6 mm) between the wafers W.

Figure 7C:
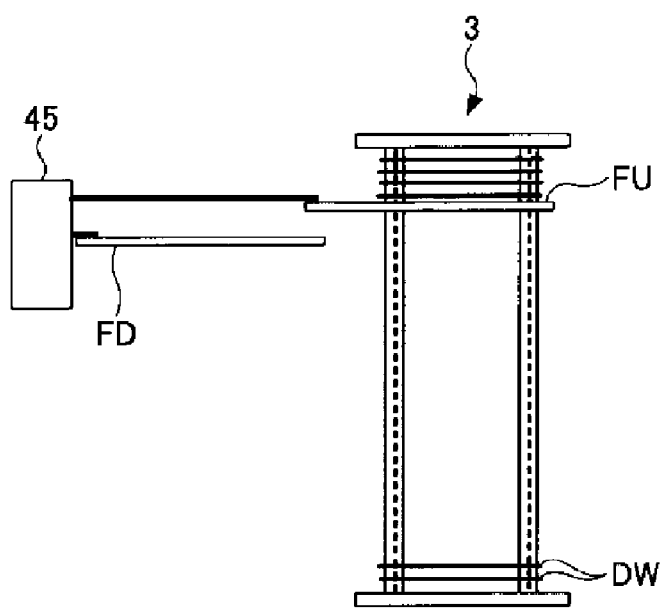
Figure 7D:
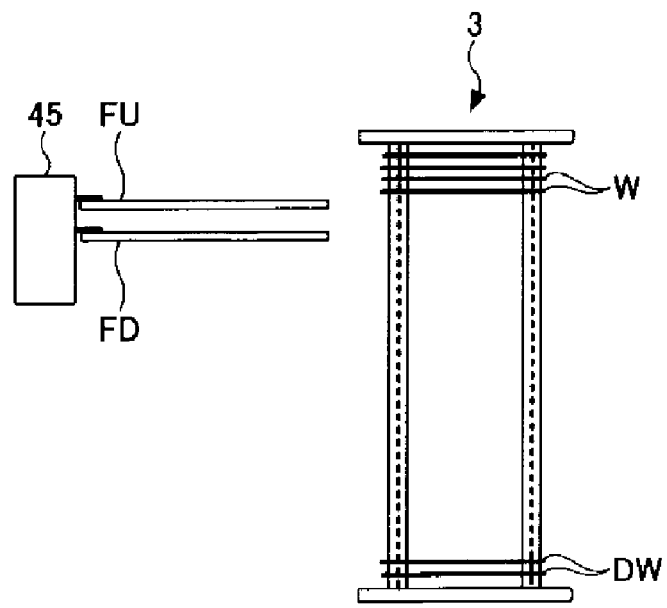

After that, the upper fork FU moves toward the wafer boat 3 such that the secondary wafer W is accommodated within the wafer boat 3 (see FIG. 7C). After the operation of the chuck mechanism of the upper fork FU is stopped, the reciprocating mechanism 45 moves downward by, e.g., 4.0 mm such that the secondary wafer W is supported by the below slit 3s in the wafer boat 3. Thereafter, the upper fork FU returns to its original position (see FIG. 7D).

In this way, the two forks F (i.e., upper and lower forks FU and FD) unload two sheets of subsequent wafers W from the carrier C and load them into the wafer boat 3 one-by-one. Such operation is repeated for all wafers W inside one carrier C so that all of the wafers W therein are loaded within the wafer boat 3. This operation may be similarly performed on another carrier C such that all of the wafers W therein are mounted within the wafer boat 3.

Thereafter, the wafer boat 3 is inserted into the heat treatment furnace 31. Then, the plurality of wafers W loaded in the wafer boat 3 are heated at a predetermined temperature by a heater (not shown) which is disposed to surround the heat treatment furnace 31. A predetermined gas is supplied from a gas supply pipe (not shown) to the inside of the heat treatment furnace 31 such that a heat treatment corresponding to the supplied gas is performed on the plurality of wafers W.

Figure 8A:
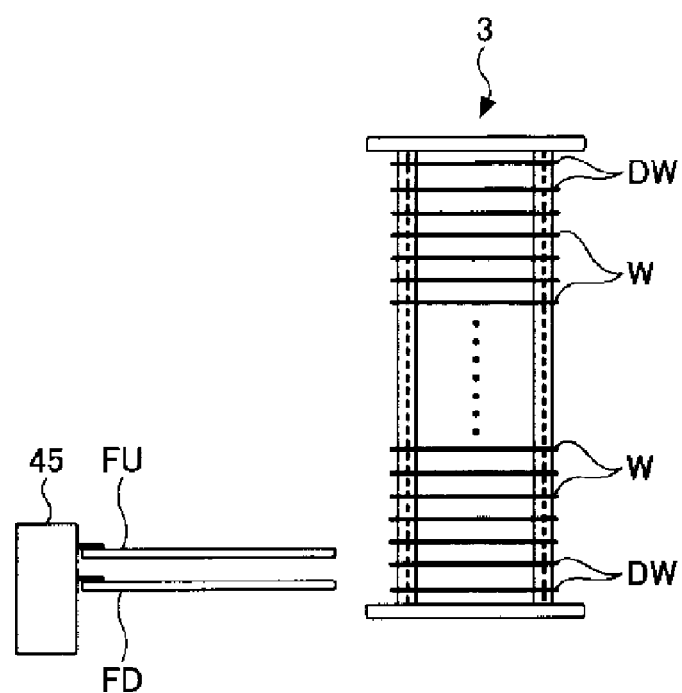
FIGS. 8A to 8D are schematic views illustrating a sequence of substrate transfer procedures in a heat treatment apparatus according to another embodiment of the present disclosure.

Upon completion of the heat treatment, the wafer boat 3 is moved downward from the heat treatment furnace 31 and is kept below the heat treatment furnace 31 (see FIG. 1) such that the wafer boat 3 and the plurality of wafers W loaded therein are cooled. After the cooling, the plurality of wafers W loaded in the wafer boat 3 are transferred to the carrier C by the wafer transfer mechanism 4. Specifically, as shown in FIG. 8A, the vertical position of the reciprocating mechanism 45 is aligned such that the upper fork FU enters below the bottommost wafer W to be processed, excluding the dummy wafers DW.

Figure 8B:
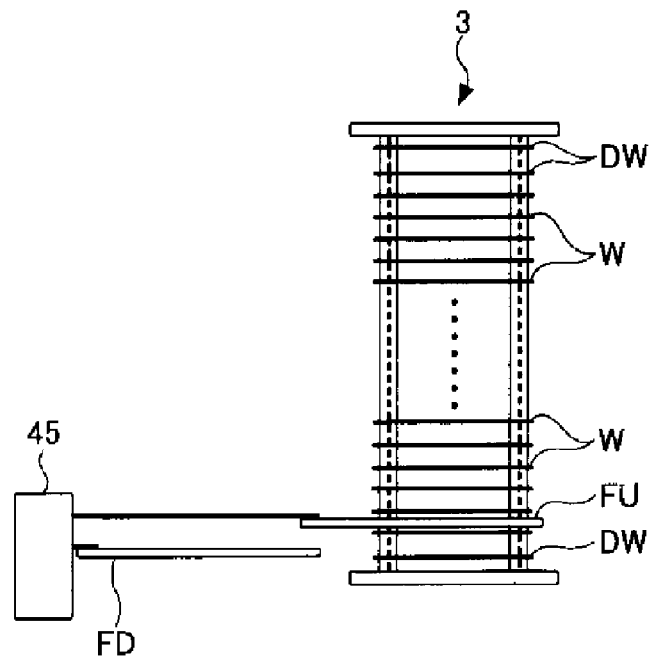
Figure 8C:
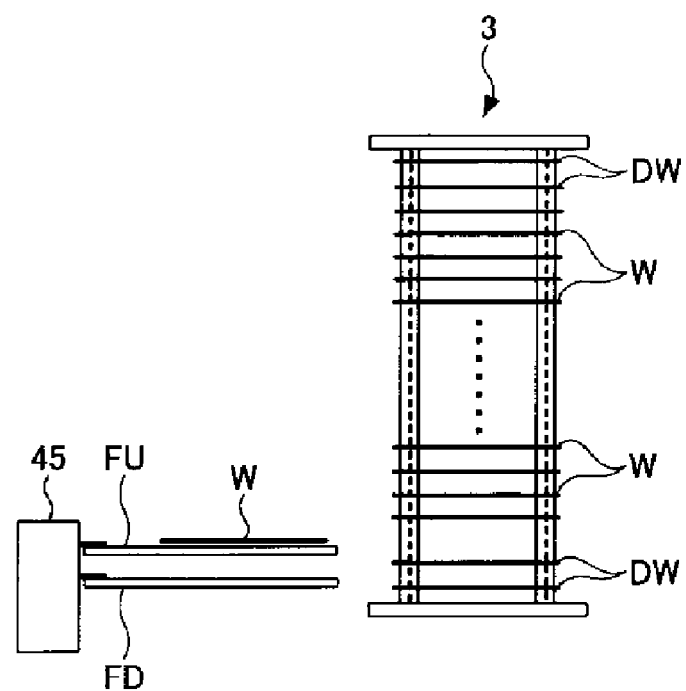
Figure 8D:
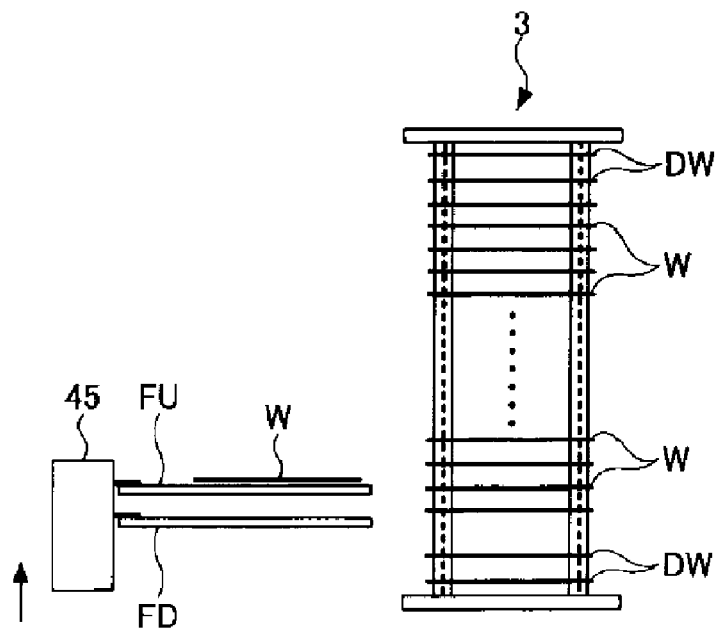
Figure 9A:
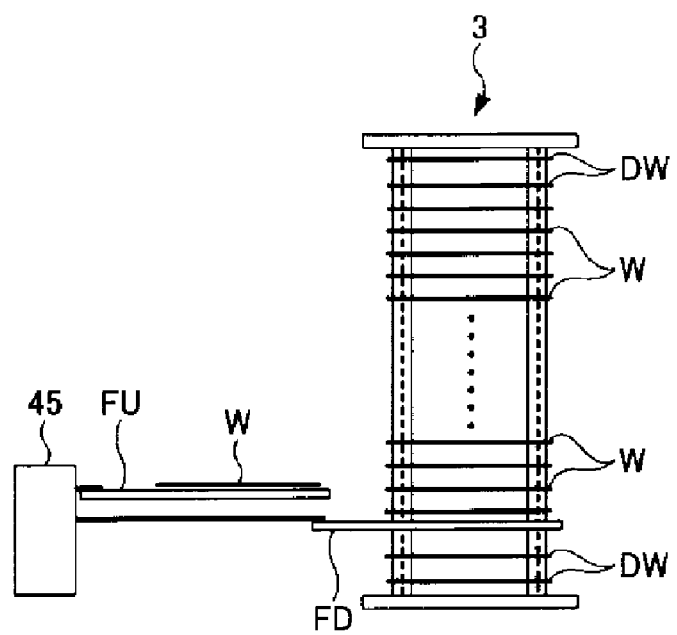
FIGS. 9A to 9E are schematic views illustrating a sequence of substrate transfer procedures, which are conducted after the procedure illustrated in FIG. 8D.
Figure 9B:
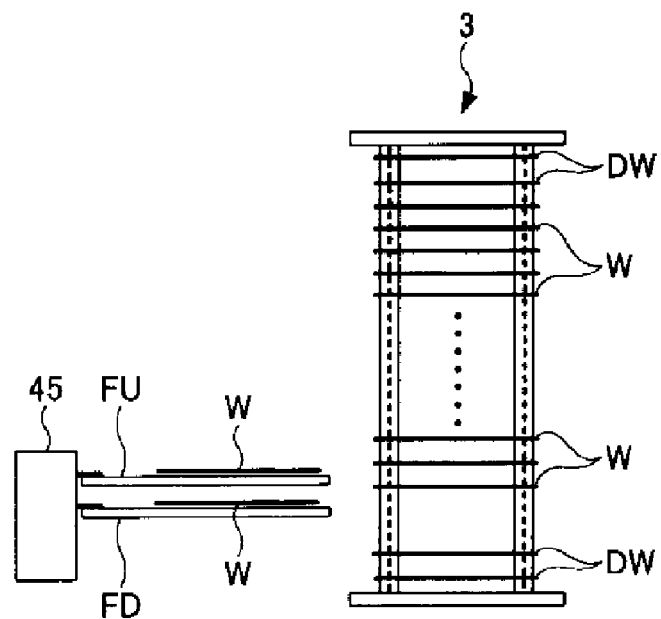

Subsequently, as shown in FIG. 8B, the upper fork FU enters below the bottommost wafer W and then the reciprocating mechanism 45 moves upward by, e.g., 4.0 mm so that the bottommost wafer W is placed on the upper fork FU. The chuck mechanism of the upper fork FU is activated and then the upper fork FU returns to its original position while holding the bottommost wafer W (see FIG. 8C). After that, as shown in FIG. 8D, the vertical position of the reciprocating mechanism 45 is aligned such that the lower fork FD is entered below a next bottommost wafer W lying immediately above the position at which the bottommost wafer W has been unloaded from the wafer boat 3 by the upper fork FU. Thereafter, as shown in FIG. 9A, the lower fork FD enters below the next bottommost wafer W and the reciprocating mechanism 45 moves upward by, e.g., 4.0 mm so that the next bottommost wafer W is placed on the lower fork FD. The chuck mechanism of the lower fork FD is activated and then the lower fork FD returns to its original position while holding the next bottommost wafer W (see FIG. 9B).

Figure 9C:
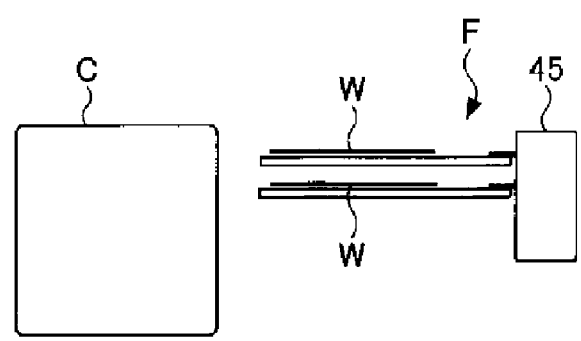
Figure 9D:
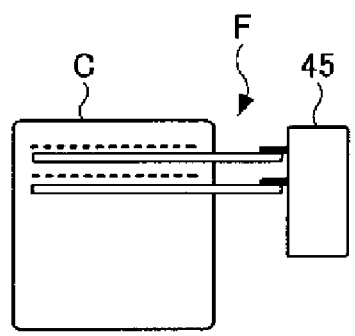
Figure 9E:
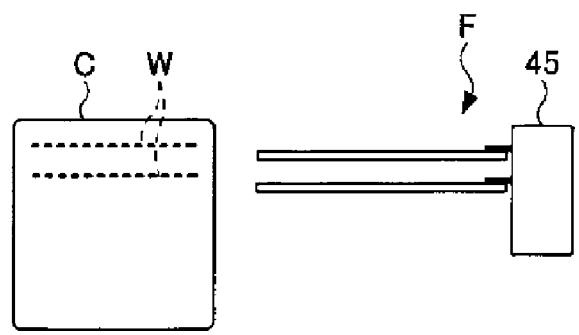

Subsequently, the transfer body 5 (shown in FIG. 4A) rotates around its vertical axis such that the upper and lower forks FU and FD each holding one of the unloaded wafers W are positioned to face the carrier C (see FIG. 9C). Thereafter, the upper and lower forks FU and FD enter into the carrier C (see FIG. 9D) to transfer the unloaded wafers W to the carrier C, and then the upper and lower forks FU and FD return to their respective original positions (see FIG. 9E). After that, the sequences, which are described with reference to FIGS. 8A to 9D, are repeated for all wafers W inside the wafer boat 3 so that all of the wafers W therein are transferred to the inside of the wafer boat 3.

As described above, according to the substrate transfer method of the aforementioned embodiment of the present disclosure, even if the plurality of wafers W could not be collectively transferred between the carrier C and the wafer boat 3 by the plurality of forks F due to a difference in the interval between the wafers in the carrier C and the interval between the wafers in the wafer boat 3, when unloading the wafers W from the carrier C, the two forks F (i.e., upper fork FU and the lower fork FD) simultaneously enter into the carrier C such that the two forks F unload respective wafers W, i.e., two sheets of wafers, and when loading the unloaded wafers W in the wafer boat 3, the upper fork FU and the lower fork FD are individually retreated such that the wafers W are loaded in the wafer boat 3 one-by-one. Therefore, it is possible to load the plurality of wafers in the wafer boat 3 in a shorter period of time compared to using, e.g., a single fork. For example, an experiment conducted by the present inventors has shown that the time spent in transferring 150 sheets of wafers W into the wafer boat 3 is about 45 minutes in the heat treatment apparatus 10 and the substrate transfer method according to the embodiments of the present disclosure. A comparison experiment where a single fork is used has shown that the time spent in transferring 150 sheets of wafers from the carrier C to the wafer boat 3 is about 59 minutes. Specifically, in the heat treatment apparatus 10 and substrate transfer method according to the embodiments of the present disclosure, it has been found that a wafer transfer time is shorten by about 15 minutes, compared to the case where the single fork is used.

Further, as described above, the difference between the interval between the forks F (i.e., first interval) and the interval between the wafers W (i.e., second interval) in the wafer boat 3 is countered by aligning (or adjusting) the vertical positions of the forks F (or the reciprocating mechanism 45) before the wafers W are inserted from the forks F into the slits 3s in the wafer boat 3. Specifically, the use of the motor M2, the encoder 55 and the counter 56 enable the alignment of the vertical positions in a precise and simple manner, thus making it possible to stably insert each wafer W into a predetermined position.

In addition, according to the substrate transfer method as described above, when the wafer W is transferred from the carrier C to the wafer boat 3, the lower fork FD inserts the primary wafer W supported thereon into a higher empty slit 3s in the wafer boat 3, and subsequently the upper fork FU inserts the secondary wafer W supported thereon into an empty slit 3s positioned immediately below the primary wafer W. Meanwhile, when the wafer W is transferred from the wafer boat 3 to the carrier C, a lower wafer W is taken by the upper fork FU and subsequently an upper wafer W is taken by the lower fork FD. In other words, as the lower fork FD supports the wafer W, the upper fork FU is not in operation. This is achieved by allowing the control unit 7 to monitor whether the wafer W is held by the lower fork FD through the chuck mechanism (including the air inlet Fs, the conduction line CL, the pipeline P, the suction mechanism S and the vacuum sensor VS) of the lower fork FD. Specifically, in some embodiments, when the vacuum sensor VS of the chuck mechanism of the lower fork FD senses that the wafer W is being held by the lower fork FD, the control unit 7 may control a signal for activating the upper fork FU to be not generated, based on the control program, which causes the heat treatment apparatus 10 to execute the substrate transfer method.

With this configuration, the upper fork FU or a wafer W supported thereby is not moved above a surface (i.e., chip formation surface) on which a semiconductor integration circuit (or chip) is formed in the wafer W held by the lower fork FD. It is assumed that if the upper fork FU holds a wafer W or releases the holding action by, e.g., the chuck mechanism, above a wafer W held by the lower fork FD, particles may be dropped onto the chip formation surface of the wafer W held by the lower fork FD. However, in the substrate transfer method according to the embodiments of the present disclosure, the upper fork FU or a wafer W supported thereby do not pass above the wafer W held by the lower fork FD, which may prevent particles from being dropped onto the chip formation surface of the wafer W held by the lower fork FD.

While in the above embodiments, the vacuum sensor VS is installed in the pipeline P, which is connected to the conduction line CL in the inside of the fork F, to measures a pressure within the pipeline P, the present disclosure is not limited thereto. Alternatively, an electrostatic sensor may be installed on the top surface of a fork F to determine the presence of the wafer W held (or supported) by the fork F.

Further, in some embodiments, an electrostatic chuck may be employed instead of the suction-type chuck mechanism. In this case, the presence of a wafer W held (or supported) by a fork F may be determined in response to the application of a voltage to the electrostatic chuck.

While in the above embodiments, the mapping sensor 6 is installed in the lower fork FD, the present disclosure is not limited thereto. Alternatively, the mapping sensor 6 may be installed in the upper fork FU.

In some embodiments, unless a sequence in which the upper fork FU unloads one sheet of wafer W from the carrier C and stops, and then the lower fork FD begins to move to unload another wafer W from the carrier C, the operation of the upper and lower forks FU and FD may not be simultaneously performed.

In addition, in order to check whether a predetermined heat treatment is normally performed on the wafers W for IC manufacture held in the wafer boat 3, one sheet of a monitor wafer may be sometimes inserted between 25 wafers W and another 25 wafers W. In this case, the fork F including the mapping sensor 6 may be employed to determine whether the monitor wafer is taken out of the wafer boat 3. The reason for this is to correctly detect the position of the monitor wafer.

Moreover, the heat treatment apparatus according to the embodiments of the present disclosure may include a thermal oxidation apparatus which performs a thermal oxidation on the surface of a silicon wafer to form a silicon oxide film thereon; a film formation apparatus which forms a thin film such as a silicon oxide film, a silicon nitride film or an amorphous silicon film on a substrate; a thermal diffusion apparatus which diffuses impurity on a substrate; or the like.

According to some embodiments of the present disclosure, it is possible to provide a heat treatment apparatus which is capable of enhancing efficiency in substrate-transferring and a method of transferring substrates to the apparatus.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A heat treatment apparatus, comprising:
   a vessel loading unit on which a substrate vessel is loaded, the substrate vessel being configured to accommodate a plurality of substrates at a first interval;
   a substrate holder configured to hold the plurality of substrates at a second interval, the second interval being smaller than the first interval;
   a substrate transfer unit having at least two substrate supporting parts capable of supporting the substrates and configured to transfer the plurality of substrates between the substrate holder and the substrate vessel, the at least two substrate supporting parts being stacked with the first interval therebetween and configured to be simultaneously advanced and retreated relative to the substrate vessel and individually advanced and retreated relative to the substrate holder; and
   a control unit, when the substrates are transferred from the substrate vessel to the substrate holder, configured to monitor whether a substrate is held by a lower substrate supporting part of the at least two substrate supporting parts to control an upper substrate supporting part of the at least two substrate supporting parts to be in an inoperative state when the substrate is held by the lower substrate supporting part, and to control that the lower substrate supporting part transfers a primary substrate supported thereon to the substrate holder and subsequently the upper substrate supporting part transfers a secondary substrate supported thereon to the substrate holder positioned below the primary substrate.

2. The apparatus of claim 1, wherein the lower substrate supporting part includes a detection unit configured to detect a presence or absence of a substrate supported by the lower substrate supporting part.

3. The apparatus of claim 2, wherein the control unit is configured to determine whether the upper substrate supporting part is operable based on the detection of the presence or absence of a substrate supported by the lower substrate supporting part detected at the detection unit.

4. The apparatus of claim 1, wherein one of the at least two substrate supporting parts includes a sensing unit configured to detect a presence of a substrate held by the substrate holder.

5. A heat treatment apparatus, comprising:
   a vessel loading unit on which a substrate vessel is loaded, the substrate vessel being configured to accommodate a plurality of substrates at a first interval;
   a substrate holder configured to hold the plurality of substrates at a second interval, the second interval being smaller than the first interval;
   a substrate transfer unit having at least two substrate supporting parts capable of supporting the substrates and configured to transfer the plurality of substrates between the substrate holder and the substrate vessel, the at least two substrate supporting parts being stacked with the first interval therebetween and configured to be simultaneously advanced and retreated relative to the substrate vessel and individually advanced and retreated relative to the substrate holder; and
   a control unit, when the substrates are transferred from the substrate holder to the substrate vessel, configured to monitor whether a substrate is held by a lower substrate supporting part of the at least two substrate supporting parts to control an upper substrate supporting part of the at least two substrate supporting parts to be in an inoperative state when the substrate is held by the lower substrate supporting part, and to control that the upper substrate supporting part unloads a lower substrate positioned at a lower position in the substrate holder from the substrate holder, and subsequently the lower substrate supporting part unloads an upper substrate positioned above the lower substrate from the substrate holder.

6. A method of transferring a plurality of substrates from a substrate vessel to a substrate holder using at least two substrate supporting parts capable of supporting the plurality of substrates, wherein the substrate vessel is configured to accommodate the plurality of substrates at a first interval, and the substrate holder is configured to hold the plurality of substrates at a second interval, the second interval being smaller than the first interval, and the at least two substrate supporting parts being stacked with the first interval therebetween, the method comprising:
   advancing the at least two substrate supporting parts simultaneously to the substrate vessel;
   receiving a respective substrate using each of the at least two substrate supporting parts;

retreating the at least two substrate supporting parts simultaneously from the substrate vessel;

monitoring whether a substrate is held by a lower substrate supporting part of the at least two substrate supporting parts to control an upper substrate supporting part of the at least two substrate supporting parts to be in an inoperative state when the substrate is held by the lower substrate supporting part; and transferring a primary substrate supported by the lower substrate supporting part to the substrate holder, and subsequently transferring a secondary substrate supported by the upper substrate supporting part to a position below the primary substrate transferred by the lower substrate supporting part in the substrate holder.

7. The method of claim 6, further comprising:

detecting whether the lower substrate supporting part supports the primary substrate;

determining whether the lower substrate supporting part supports the primary substrate based on the detecting; and controlling, if it is determined at the determining that the lower substrate supporting part supports the primary substrate, the upper substrate supporting part to not be in operation.

8. A method of transferring a plurality of substrates from a substrate holder to a substrate vessel using at least two substrate supporting parts capable of supporting the plurality of substrates, wherein the substrate vessel is configured to accommodate the plurality of substrates at a first interval, and the substrate holder is configured to hold the plurality of substrates at a second interval, the second interval being smaller than the first interval, and the at least two substrate supporting parts being stacked with the first interval therebetween, the method comprising:

monitoring whether a substrate is held by a lower substrate supporting part of the at least two substrate supporting parts to control an upper substrate supporting part of the at least two substrate supporting parts to be in an inoperative state when the substrate is held by the lower substrate supporting part;

unloading a lower substrate positioned at a lower position in the substrate holder using the upper substrate supporting part and subsequently unloading an upper substrate positioned above the lower substrate in the substrate holder using the lower substrate supporting part;

advancing the upper substrate supporting part supporting the lower substrate and the lower substrate supporting part supporting the upper substrate simultaneously to the substrate vessel;

delivering the lower and upper substrates within the substrate vessel; and retreating the upper and lower substrate supporting parts simultaneously from the substrate vessel.

\* \* \* \* \*